(12) United States Patent
Hsu et al.

(10) Patent No.: US 10,490,235 B2
(45) Date of Patent: Nov. 26, 2019

(54) DIFFERENTIAL READ-ONLY MEMORY (ROM) DEVICE

(71) Applicant: Taiwan Semiconductor Manufacturing Co., Ltd., Hsinchu (TW)

(72) Inventors: Kuoyuan Hsu, San Jose, CA (US); Jacklyn Chang, San Ramon, CA (US)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/994,264

(22) Filed: May 31, 2018

(65) Prior Publication Data

US 2019/0237113 A1   Aug. 1, 2019

Related U.S. Application Data

(60) Provisional application No. 62/623,202, filed on Jan. 29, 2018.

(51) Int. Cl.
| | |
|---|---|
| *G11C 7/02* | (2006.01) |
| *G11C 7/06* | (2006.01) |
| *G11C 7/18* | (2006.01) |
| *G11C 17/12* | (2006.01) |
| *G11C 7/12* | (2006.01) |

(52) U.S. Cl.
CPC .............. *G11C 7/062* (2013.01); *G11C 7/12* (2013.01); *G11C 7/18* (2013.01); *G11C 17/12* (2013.01)

(58) Field of Classification Search
CPC ....... G11C 11/419; G11C 7/12; G11C 11/412; G11C 7/065; G11C 11/4091; G11C 11/413; G11C 16/26; G11C 7/067; G11C 7/08; G11C 11/39; G11C 11/4076; G11C 11/4094; G11C 7/1051
USPC ..... 365/205, 203, 207, 189.07, 154, 189.04, 365/185.25, 189.09, 226, 185.18, 189.05, 365/148, 149, 163, 185.13
See application file for complete search history.

(56) References Cited

U.S. PATENT DOCUMENTS

| | | |
|---|---|---|
| 7,170,805 B2 | 1/2007 | Song |
| 7,949,933 B2 | 5/2011 | Nagai |

(Continued)

FOREIGN PATENT DOCUMENTS

| | | |
|---|---|---|
| TW | 200502957 | 1/2005 |
| TW | 200539191 | 12/2005 |
| TW | 201329998 A1 | 7/2013 |

*Primary Examiner* — Thong Q Le
(74) *Attorney, Agent, or Firm* — Sterne, Kessler, Goldstein & Fox P.L.L.C.

(57) ABSTRACT

A read-only memory (ROM) device includes a memory cell that is electrically coupled to a bitline (BL) or to a $\overline{BL}$ which represents a complement of the BL. The ROM device precharges the BL and the $\overline{BL}$ to a first logical value. The ROM device activates the memory cell which discharges the BL when the memory cell is coupled to the BL or discharges the $\overline{BL}$ when the memory cell is coupled to the $\overline{BL}$. The ROM device reads the first logical value as being stored within the memory cell when the BL is less than the $\overline{BL}$. Otherwise, the ROM device reads the second logical value as being stored within the memory cell when the BL is greater than the $\overline{BL}$.

19 Claims, 9 Drawing Sheets

(56) References Cited

U.S. PATENT DOCUMENTS

| | | |
|---|---|---|
| 8,120,939 B2 | 2/2012 | Liaw |
| 2016/0055887 A1* | 2/2016 | Katoch ............... G11C 11/4076 |
| | | 365/207 |

* cited by examiner

DIFFERENTIAL READ-ONLY MEMORY (ROM) DEVICE

CROSS-REFERENCE TO RELATED APPLICATIONS

The present application claims the benefit of U.S. Provisional Patent Appl. No. 62/623,202, filed Jan. 29, 2018, which is incorporated herein by reference in its entirety.

BACKGROUND

A memory device is an electronic device for storing electronic data. The memory device can be implemented as volatile memory, such as random-access memory (RAM), which requires power to maintain its stored information or non-volatile memory, such as read-only memory (ROM), which can maintain its stored information even when not powered. The ROM can be implemented as a programmable read-only memory (PROM), a one-time programmable ROM (OTP), an erasable programmable read-only memory (EPROM) and/or an electrically erasable programmable read-only memory (EEPROM) to provide some examples. The electronic data can be read by selectively accessing one or more memory cells within the ROM through various control lines.

BRIEF DESCRIPTION OF THE DRAWINGS/FIGURES

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a block diagram of an exemplary read-only memory (ROM) device according to an exemplary embodiment of the present disclosure;

FIG. 2, FIG. 3A, and FIG. 3B illustrate a first exemplary operation of the exemplary ROM device according to an exemplary embodiment of the present disclosure;

Figure 7A:
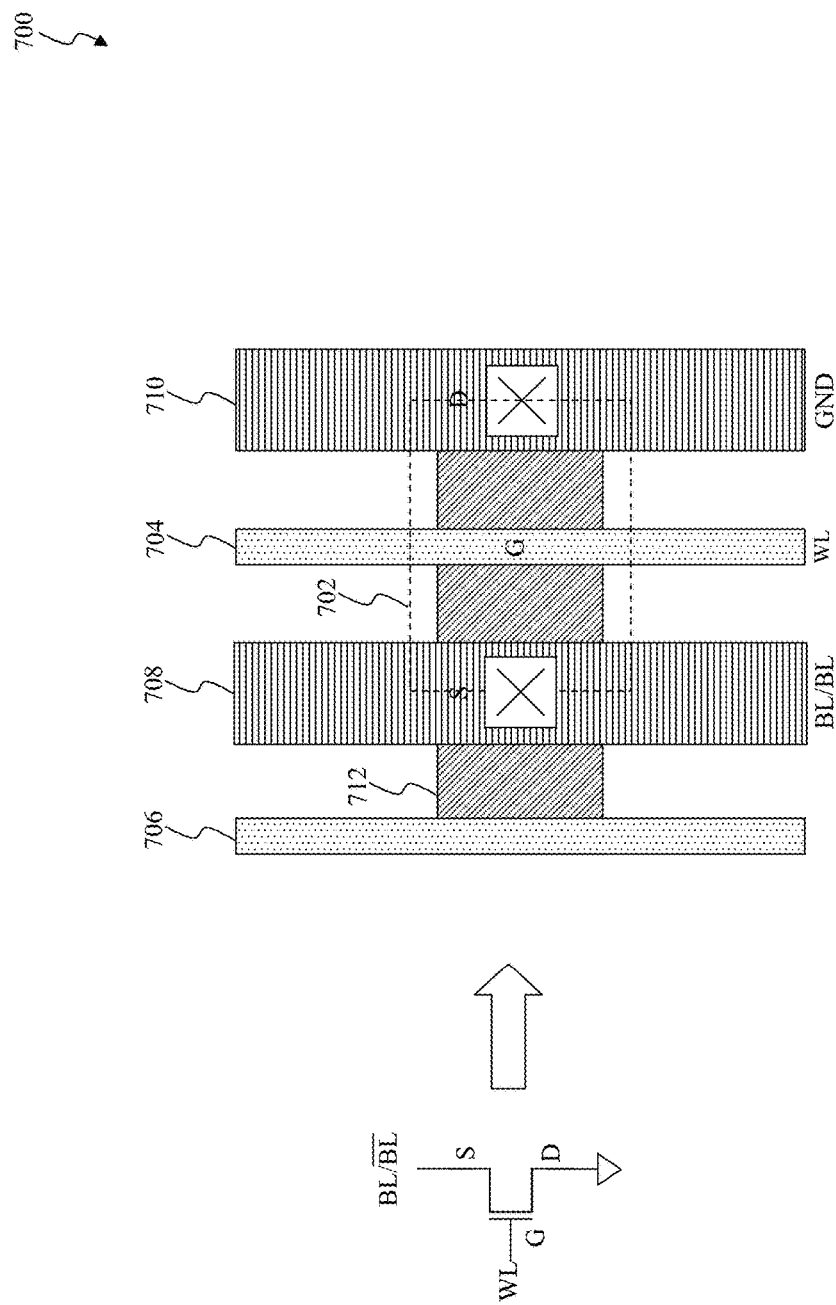
Figure 7B:
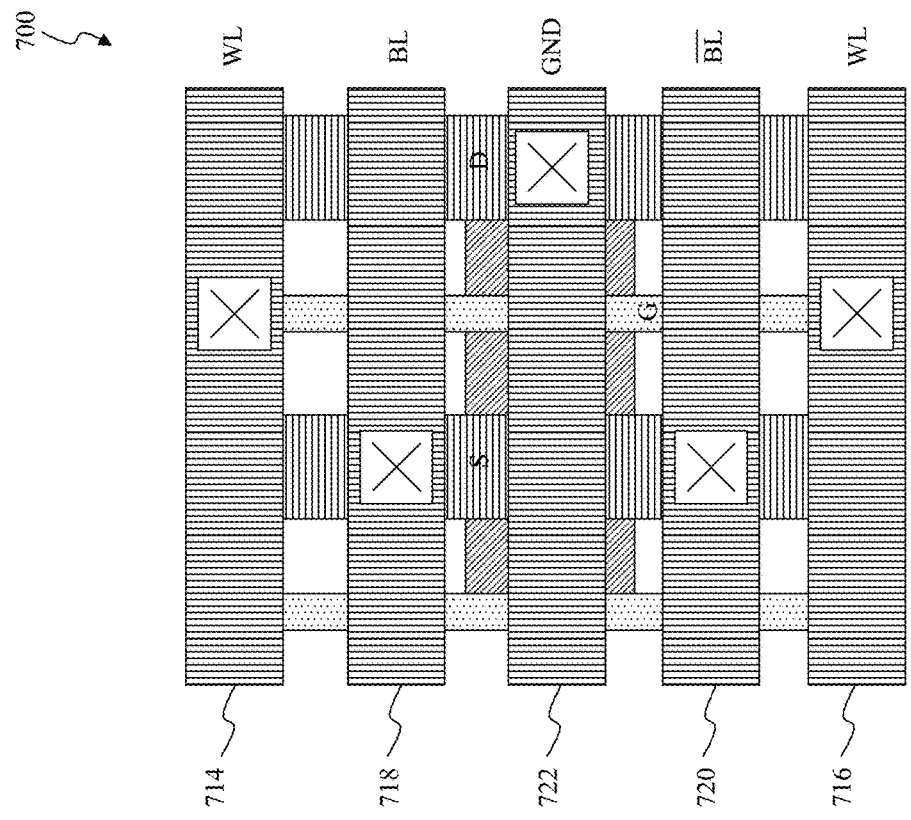
Figure 7B:
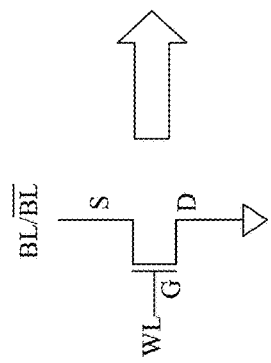
Figure 8:
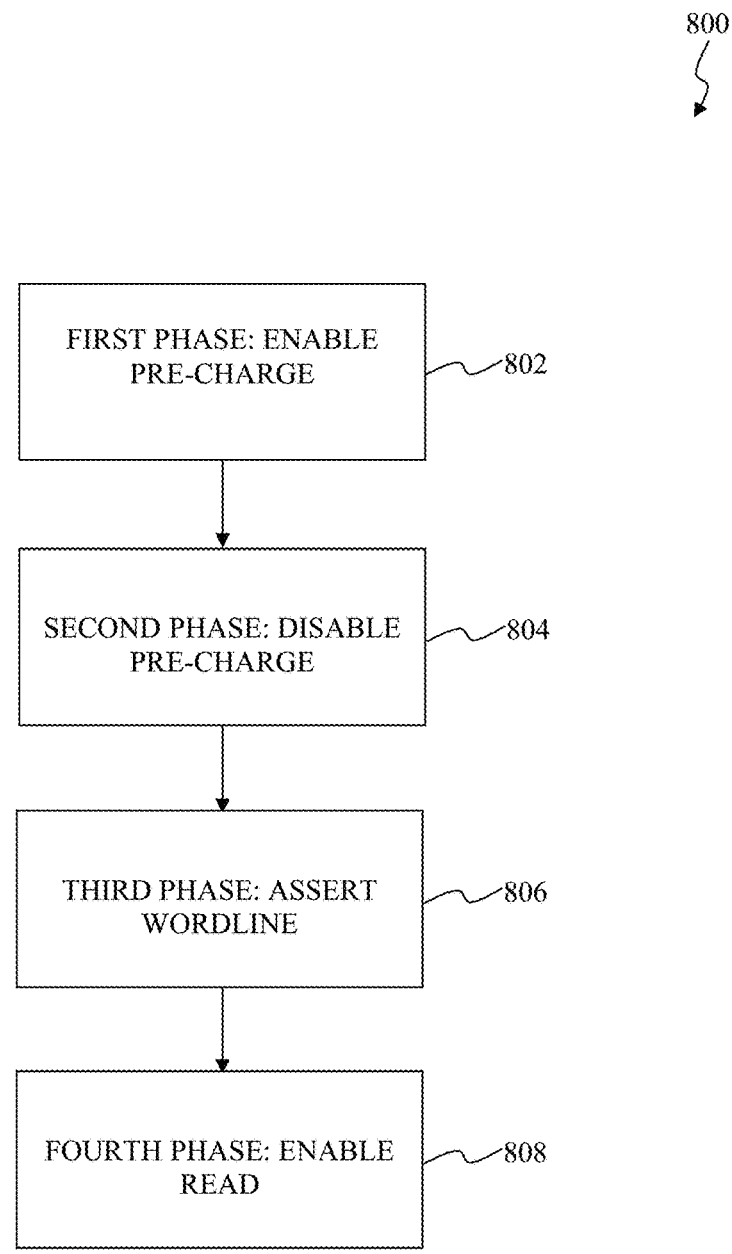

FIG. 5, FIG. 6A, FIG. 6B, and FIG. 6C illustrate a second exemplary operation of the exemplary ROM device according to an exemplary embodiment of the present disclosure;

FIGS. 7A and 7B illustrate integrated circuit layouts for an exemplary memory cell within the ROM device according to an exemplary embodiment of the present disclosure; and FIG. 8 illustrates a flowchart of exemplary operations for the ROM device according to an exemplary embodiment of the present disclosure. The disclosure is not limited to this operational description.

The present disclosure will now be described with reference to the accompanying drawings.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

A read-only memory (ROM) device includes a memory cell that is electrically coupled to a bitline (BL) or to a $\overline{BL}$ which represents a complement of the BL. The ROM device precharges the BL and the $\overline{BL}$ to a first logical value. The ROM device activates the memory cell which discharges the BL when the memory cell is coupled to the BL or discharges the $\overline{BL}$ when the memory cell is coupled to the $\overline{BL}$. The ROM device reads the first logical value as being stored within the memory cell when the BL is less than the $\overline{BL}$. Otherwise, the ROM device reads the second logical value as being stored within the memory cell when the BL is greater than the $\overline{BL}$.

Exemplary Read-Only Memory (ROM) Device

Figure 1:
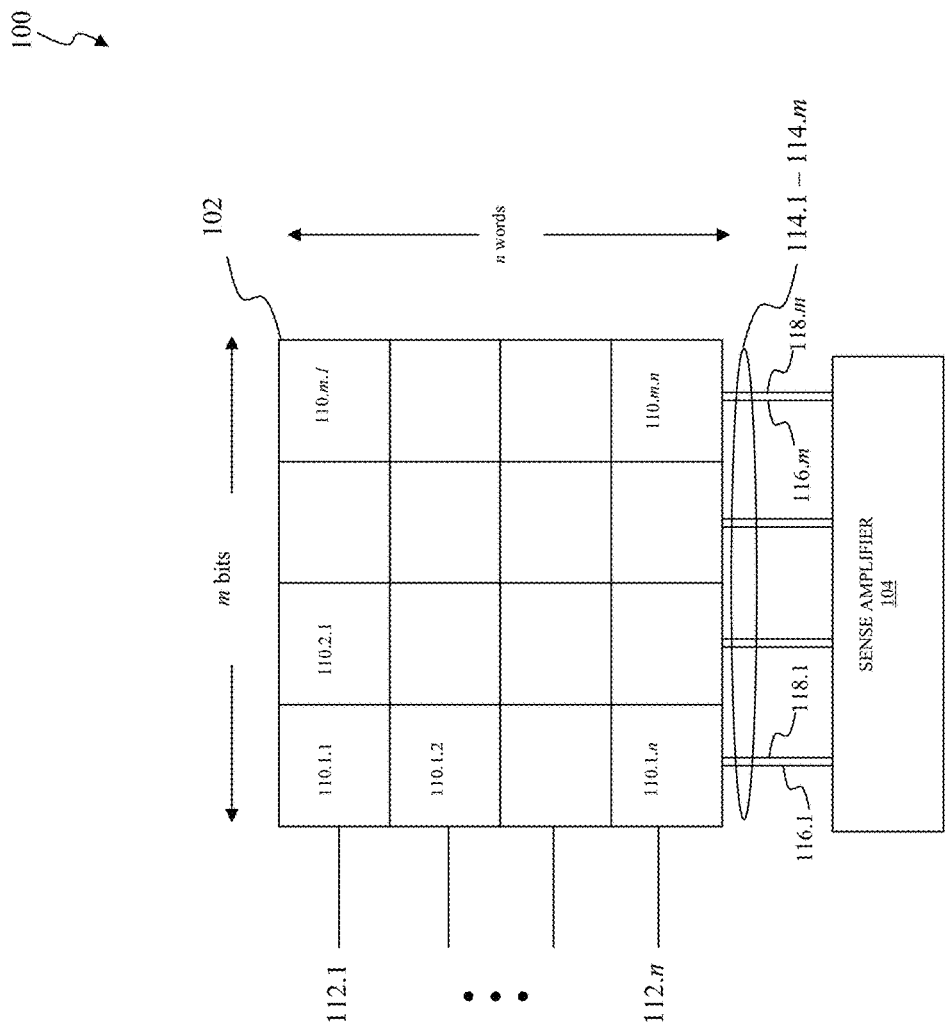

FIG. 1 illustrates a block diagram of an exemplary read-only memory (ROM) device according to an exemplary embodiment of the present disclosure. A ROM device 100 can be programmed to store information into one or more memory cells. In the exemplary embodiment illustrated in FIG. 1, the ROM device 100 can be implemented as a programmable read-only memory (PROM), a one-time programmable ROM (OTP), an erasable programmable read-only memory (EPROM) and/or an electrically erasable programmable read-only memory (EEPROM) to provide some examples. As to be discussed in further detail below, the ROM device 100 utilizes a differential signaling scheme to read the stored information from the one or more memory cells. As illustrated in FIG. 1, the ROM device 100 includes a memory array 102 and a differential sense amplifier 104. Although not illustrated in FIG. 1, the ROM device 100 can include other electronic circuitry, such as a row-address decoder and/or a column-address decoder to provide some examples, which will be apparent to those skilled in the relevant art(s) without departing from the spirit and scope of the present disclosure.

The memory array 102 includes memory cells 110.1.1 through 110.$m.n$ that are configured into an array of m columns and n rows. However, other arrangements for the memory cells 110.1.1 through 110.$m.n$ are possible without departing from the spirit and scope of the present disclosure. In the exemplary embodiment illustrated in FIG. 1, the memory cells 110.1.1 through 110.$m.n$ are connected to corresponding wordlines (WLs) from among WLs 112.1 through 112.$n$ and corresponding differential bitlines (BLs) from among differential BLs 114.1 through 114.$m$, shown as differential BLs 114 in FIG. 1. In the exemplary embodiment illustrated in FIG. 1, the differential bitlines (BLs) 114.1 through 114.$m$ include BLs 116.1 through 116.$m$ and $\overline{BLs}$ 118.1 through 118.$m$. The $\overline{BLs}$ 118.1 through 118.$m$ represent complements of the BLs 116.1 through 116.$m$. In an exemplary embodiment, the memory cells 110.1.1 through 110.$m.n$ in each of the m columns of the memory array 102 share a common differential BL from among the differential BLs 114.1 through 114.m. Similarly, the memory cells 110.1.1 through 110.m.n in each of n rows of the memory array 102 share a common WL from among the WLs 112.1 through 112.n. For example, as shown in FIG. 1, the memory cells 110.1.1 through 110.m.1 of row one of the memory array 102 share the WL 112.1 and the memory cells 110.m.1 through 110.m.n of column m of the memory array 102 share the differential BL 114.m.

In the exemplary embodiment illustrated in FIG. 1, the memory cells 110.1.1 through 110.m.n are electrically coupled to their corresponding BLs from among the BLs 116.1 through 116.m to store a first logical value, such as a logical one, or to their corresponding $\overline{BLs}$ from among $\overline{BLs}$ 118.1 through 118.m to store a second logical value, such as a logical zero. In the exemplary embodiment illustrated in FIG. 1, the memory cells 110.1.1 through 110.m.n represent non-programmable memory cells that are electrically designed, or "hard-wired," to be electrically coupled to their corresponding BLs from among the BLs 116.1 through 116.m and/or their corresponding $\overline{BLs}$ from among $\overline{BLs}$ 118.1 through 118.m during fabrication of the ROM device 100. However, those skilled in the relevant art(s) will recognize the memory cells 110.1.1 through 110.m.n can represent programmable memory cells that utilize electromagnetic energy, such as ultraviolet light to provide an example, to electrically couple to their corresponding BLs from among the BLs 116.1 through 116.m and/or their corresponding $\overline{BLs}$ from among $\overline{BLs}$ 118.1 through 118.m without departing from the spirit and scope of the present disclosure.

During operation of the ROM device 100, one or more of the BLs 116.1 through 116.m and one or more of the $\overline{BLs}$ 118.1 through 118.m are pre-charged to the first logical value, such as the logical one. Thereafter, a memory cell from among the memory cells 110.1.1 through 110.m.n is activated by asserting its corresponding WL from among the WLs 112.1 through 112.n. This assertion of the corresponding WL discharges a corresponding BL of the memory cell from the first logical value when the memory cell is electrically coupled to its corresponding BL or discharges a corresponding $\overline{BL}$ of the memory cell from the first logical value when the memory cell is electrically coupled to its corresponding $\overline{BL}$. In an exemplary embodiment, the assertion of the corresponding WL discharges the corresponding BL of the memory cell from the first logical value to be less than a read margin value when the memory cell is electrically coupled to its corresponding BL or discharges the corresponding $\overline{BL}$ of the memory cell from the first logical value to be less than the read margin value when the memory cell is electrically coupled to its corresponding $\overline{BL}$. In this exemplary embodiment, the read margin value represents a logical value, less than the first logical value, at which the sense amplifier 104 can recognize differences between the corresponding BL and the corresponding $\overline{BL}$. Thereafter, the sense amplifier 104 monitors the corresponding BL and the corresponding $\overline{BL}$ to read the information stored in the memory cell. The sense amplifier 104 reads the first logical value, such as the logical one, as being stored within the memory cell when the corresponding BL of the memory cell is less than the corresponding $\overline{BL}$ of the memory cell. Otherwise, the sense amplifier 104 reads a second logical value, such as a logical zero, as being stored within the memory cell when the corresponding BL of the memory cell is greater than the corresponding $\overline{BL}$ of the memory cell. From the exemplary embodiment above, the sense amplifier 104 reads the first logical value as being stored within the memory cell when the corresponding BL of the memory cell is less than the corresponding $\overline{BL}$ of the memory cell by at least the read margin value or the second logical value as being stored within the memory cell when the corresponding BL of the memory cell is greater than the corresponding $\overline{BL}$ of the memory cell by at least the read margin value.

As an example of this operation, a memory cell 110.1 from among the memory cells 110.1.1 through 110.m.n can be programmed to store a logical one, by electrically coupling the memory cell 110.1 to the BL 116.1. In this example, the BL 116.1 and the $\overline{BL}$ 118.1 are pre-charged to the logical one. Thereafter, the memory cell 110.1 is activated by asserting the WL 112.1. This assertion of the WL 112.1 discharges the BL 116.1 to be less than the logical one. Thereafter, the sense amplifier 104 reads the logical one as being stored within the memory cell 110.1 when the BL 116.1 is less than the $\overline{BL}$ 118.1.

As another example of this operation, the memory cell 110.1 can be programmed to store a logical zero by electrically coupling the memory cell 110.1 to the $\overline{BL}$ 118.1. In this other example, the BL 116.1 and the $\overline{BL}$ 118.1 are pre-charged to the logical one. Thereafter, the memory cell 110.1 is activated by asserting the WL 112.1. This assertion of the WL 112.1 discharges the $\overline{BL}$ 118.1 to be less than the logical one. Thereafter, the sense amplifier 104 reads the logical zero as being stored within the memory cell 110.1 when the BL 116.1 is greater than the $\overline{BL}$ 118.1.

First Exemplary Operation of the Exemplary Read-Only Memory (ROM) Device

Figure 2:
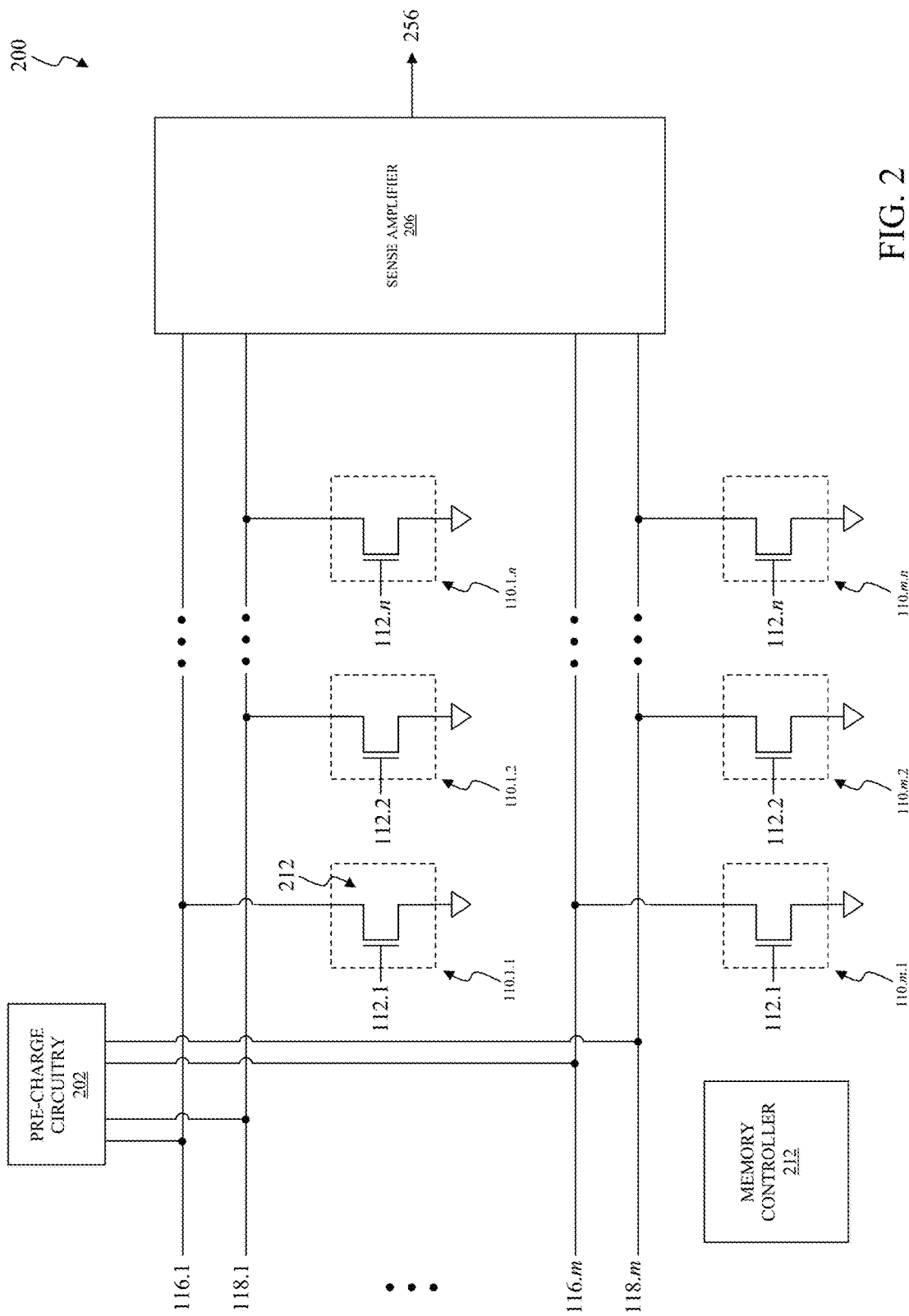
Figure 3A:
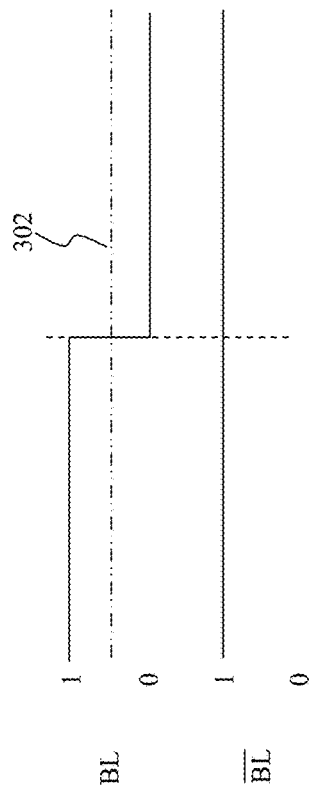
Figure 3B:
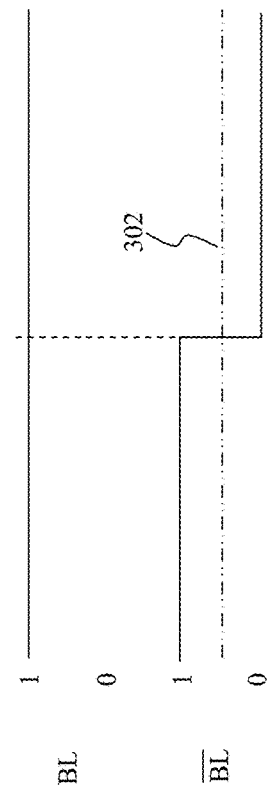

FIG. 2, FIG. 3A, and FIG. 3B illustrate a first exemplary operation of the exemplary ROM device according to an exemplary embodiment of the present disclosure. In the exemplary embodiment illustrated in FIG. 2, a ROM device 200 represents non-programmable device whose memory cells are electrically designed, or "hard-wired," to be electrically coupled to their corresponding BLs from among the BLs 116.1 through 116.m or their corresponding $\overline{BLs}$ from among $\overline{BLs}$ 118.1 through 118.m as described above in FIG. 1. In the exemplary embodiments illustrated in FIG. 2, FIG. 3A, and FIG. 3B, the memory cells can be "hard-wired" to their corresponding BLs from among the BLs 116.1 through 116.m to store a first logical value, such as a logical one. Otherwise, the memory cells can be "hard-wired" to their corresponding $\overline{BLs}$ from among $\overline{BLs}$ 118.1 through 118.m to store a second logical value, such as a logical zero. The ROM device 200 includes the memory cells 110.1.1 through 110.m.n as described above in FIG. 1, pre-charge circuitry 202, a differential sense amplifier 206, and a memory controller 212. The ROM device 200 can represent an exemplary embodiment of the ROM device 100 as described above in FIG. 1. As such, the differential sense amplifier 206 can represent an exemplary embodiment of the sense amplifier 104 as described above in FIG. 1.

As illustrated in FIG. 2, each of the memory cells 110.1.1 through 110.m.n can be implemented using a switching device 212, such as an n-type metal-oxide-semiconductor field-effect (NMOS) transistor to provide an example. In this exemplary embodiment, the switching device 212 can be electrically coupled to a corresponding BL from among the BLs 116.1 through 116.m to store a first logical value, such as a logical one, or to a corresponding $\overline{BL}$ from among the $\overline{BLs}$ 118.1 through 118.m to store a second logical value, such as a logical zero. For example, the switching device 212 of the memory cell 110.1.1 is electrically coupled to the BL 116.1 to store a logical one in the memory cell 110.1.1 as illustrated in FIG. 2. As another example, the switching device 212 of the memory cell 110.1.2 is electrically coupled to the $\overline{BL}$ 118.1 to store a logical zero in the memory cell 110.1.2 as illustrated in FIG. 2. The electrical coupling of the memory cells 110.1.1 through 110.m.n to the BLs 116.1 through 116.m and/or the $\overline{BLs}$ 118.1 through 118.m as illustrated in FIG. 2 is for illustrative purposes only. Those skilled in the relevant art(s) will recognize different electrical couplings are possible without departing from the spirit and scope of the present disclosure.

To read information stored in a memory cell 110.x from among the memory cells 110.1.1 through 110.m.n, the memory controller 212 receives an address identifying a row and a column of the memory cell 110.x within the memory array 102. Thereafter, the pre-charge circuitry 202 selectively charges one or more of the BLs 116.1 through 116.m and one or more of the corresponding $\overline{BLs}$ 118.1 through 118.m to the first logical value, such as a logical one. This charging of the one or more of the BLs 116.1 through 116.m and the one or more of the corresponding $\overline{BLs}$ 118.1 through 118.m is referred to as pre-charging since it occurs before the information is read from the memory cell 110.x.

Thereafter, the memory controller 212 asserts, as indicated by a vertical dashed in FIG. 3A and FIG. 3B, a WL.x from among WLs 112.1 through 112.n which corresponds to the column of the memory cell 110.x within the memory array 102 to activate the memory cell 110.x. The memory cell 110.x, when activated by the assertion of the WL.x, causes a BL 116.x from among the BLs 116.1 through 116.m which corresponds to the memory cell 110.x to discharge from the first logical value when the memory cell 110.x is electrically coupled to the BL 116.x as illustrated in FIG. 3A. Otherwise, the memory cell 110.x, when activated by the assertion of the WL.x, causes a $\overline{BL}$ 118.x from among the $\overline{BLs}$ 118.1 through 118.m which corresponds to the memory cell 110.x to discharge from the first logical value when the memory cell 110.x is electrically coupled to the $\overline{BL}$ 118.x as illustrated in FIG. 3B.

In the exemplary embodiment illustrated in FIG. 2, the differential sense amplifier 206 monitors the BLs 116.1 through 116.m and the $\overline{BLs}$ 118.1 through 118.m to provide a digital output 256. As illustrated in FIG. 2, the differential sense amplifier 206 selects the BL 116.x from among the BLs 116.1 through 116.m and the $\overline{BL}$ 118.x from among the $\overline{BLs}$ 118.1 through 118.m which correspond to the row of the memory cell 110.x within the memory array 102. The differential sense amplifier 206 reads a first logical value, such as the logical one, as being stored within the memory cell 110.x when the BL 116.x is less than the $\overline{BL}$ 118.x. As illustrated in FIG. 3A, the differential sense amplifier 206 reads the first logical value as being stored within the memory cell 110.x when the BL 116.x is less than the $\overline{BL}$ 118.x by at least a read margin value 302. Otherwise, the sense amplifier 104 reads a second logical value, such as the logical zero, as being stored within the memory cell 110.x when the BL 116.x is greater than the $\overline{BL}$ 118.x. As illustrated in FIG. 3B, the sense amplifier 104 reads the second logical value, such as the logical zero, as being stored within the memory cell 110.x when the BL 116.x is greater than the $\overline{BL}$ 118.x by at least the read margin value 302.

Figures 4A, 4B:
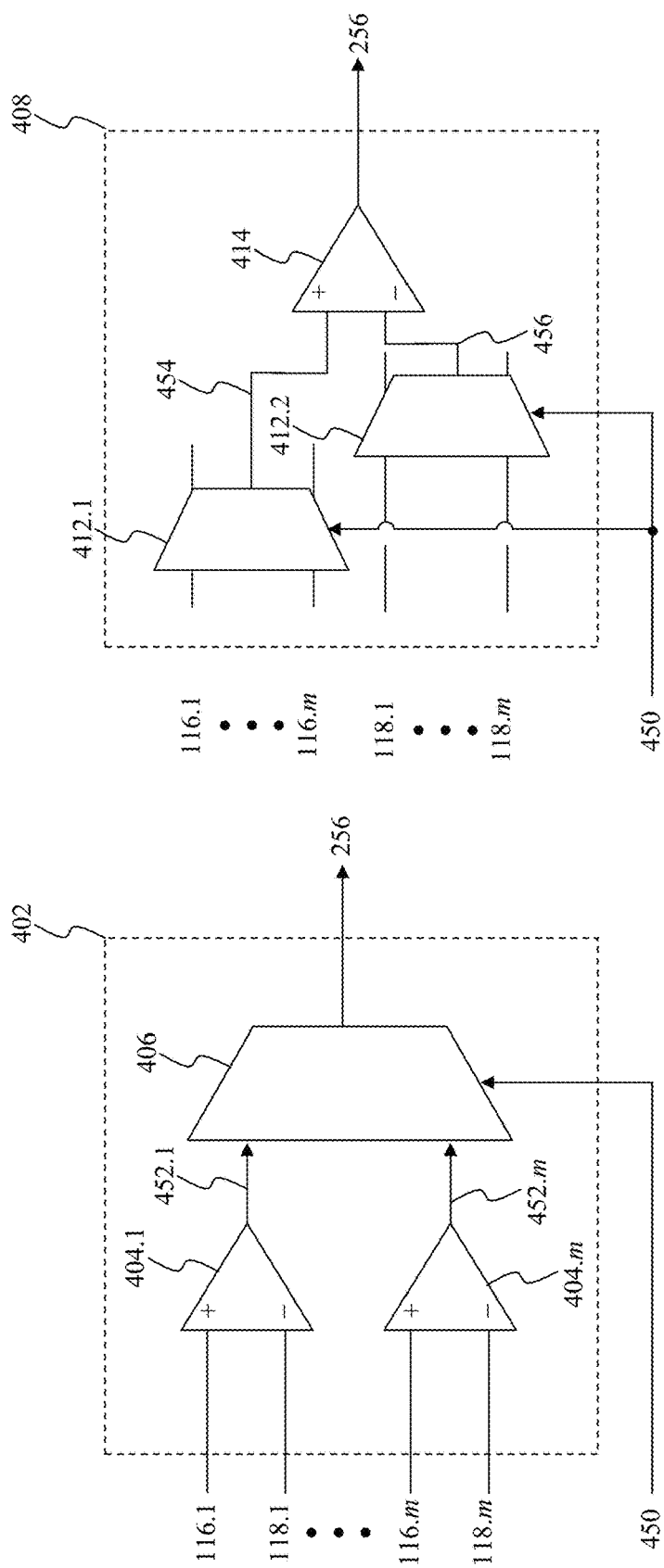
FIG. 4A illustrates a first exemplary differential sense amplifier that can be implemented within the exemplary ROM device according to an exemplary embodiment of the present disclosure.
FIG. 4B illustrates a second exemplary differential sense amplifier that can be implemented within the exemplary ROM device according to an exemplary embodiment of the present disclosure.

Exemplary Differential Sense Amplifiers that can be Implemented within the Exemplary ROM Device FIG. 4A illustrates a first exemplary differential sense amplifier that can be implemented within the exemplary ROM device according to an exemplary embodiment of the present disclosure. A differential sense amplifier 402 as illustrated in FIG. 4A reads the BLs 116.1 through 116.m and the $\overline{BLs}$ 118.1 through 118.m to determine whether a first logical value, such as the logical one, is stored within a memory cell 110.x from among the memory cells 110.1.1 through 110.m.n or a second logical value, such as the logical zero, is stored within the memory cell 110.x. In the exemplary embodiment illustrated in FIG. 4A, the differential sense amplifier 402 includes comparator circuits 404.1 through 404.m and a multiplexer circuit 406. The differential sense amplifier 402 can represent an exemplary embodiment of the differential sense amplifier 206 as described above in FIG. 2 and/or the differential sense amplifier 104 as described above in FIG. 1.

In the exemplary embodiment illustrated in FIG. 4A, each of the comparator circuits 404.1 through 404.m selectively compare a BL from among the BLs 116.1 through 116.m with its corresponding $\overline{BL}$ from among the $\overline{BLs}$ 118.1 through 118.m to provide a corresponding row logical value from among row logical values 452.1 through 452.m. In an exemplary embodiment, each of the row logical values 452.1 through 452.m corresponds to a logical value within a row within the memory array 102. Thereafter, the comparator circuits 404.1 through 404.m provide the first logical values, such as the logical ones to provide an example, when their corresponding BLs 116.1 through 116.m are less than their corresponding $\overline{BLs}$ 118.1 through 118.m. In an exemplary embodiment, the comparator circuits 404.1 through 404.m provide the first logical values when their corresponding BLs 116.1 through 116.m are less than their corresponding $\overline{BLs}$ 118.1 through 118.m by, for example, at least a read margin value. Otherwise, the comparator circuits 404.1 through 404.m provide the second logical values, such as the logical zeros to provide an example, when their corresponding BLs 116.1 through 116.m are greater than their corresponding $\overline{BLs}$ 118.1 through 118.m. In another exemplary embodiment, the comparator circuits 404.1 through 404.m provide the second logical values, such as the logical zeros to provide an example, when their corresponding BLs 116.1 through 116.m are greater than their corresponding $\overline{BLs}$ 118.1 through 118.m by, for example, at least the read margin value.

As illustrated in FIG. 4A, the multiplexer circuit 406 selectively chooses the digital output 256 from among the row logical values 452.1 through 452.m. In the exemplary embodiment illustrated in FIG. 4A, the multiplexer circuit 406 selectively chooses the digital output 256 in response to a row selection signal 450. The row selection signal 450 indicates a row of memory cells from among the rows of memory cells within the memory array 102 having the memory cell 110.x.

FIG. 4B illustrates a second exemplary differential sense amplifier that can be implemented within the exemplary ROM device according to an exemplary embodiment of the present disclosure. A differential sense amplifier 408 as illustrated in FIG. 4B reads the BLs 116.1 through 116.m and the $\overline{BLs}$ 118.1 through 118.m to determine whether a first logical value, such as the logical one, is stored within a memory cell 110.x from among the memory cells 110.1.1 through 110.m.n or a second logical value, such as the logical zero, is stored within the memory cell 110.x. In the exemplary embodiment illustrated in FIG. 4B, the differential sense amplifier 408 includes multiplexer circuits 412.1 and 412.2 and a comparator circuit 414. The differential sense amplifier 408 can represent an exemplary embodiment of the differential sense amplifier 206 as described above in FIG. 2 and/or the differential sense amplifier 104 as described above in FIG. 1.

In the exemplary embodiment illustrated in FIG. 4B, the multiplexer circuit 412.1 selects a BL 454 from among the BLs 116.1 through 116.m and the multiplexer circuit 412.2 selects a $\overline{BL}$ 456 from among the $\overline{BLs}$ 118.1 through 118.*m*. In an exemplary embodiment, the multiplexer circuit 412.1 selects the BL 454 and the multiplexer circuit 412.2 selects the $\overline{BL}$ 456 in response to the row selection signal 450 as described above in FIG. 4A.

In the exemplary embodiment illustrated in FIG. 4B, the comparator circuit 414 selectively compares the BL 454 with the $\overline{BL}$ 456. Thereafter, the comparator circuit 414 provides the first logical value, such as the logical one to provide an example, as the digital output 256 when the BL 454 is less than the $\overline{BL}$ 456. In an exemplary embodiment, the comparator circuit 414 provides the first logical value when the BL 454 is less than the $\overline{BL}$ 456 by, for example, at least a read margin value. Otherwise, the comparator circuit 414 provides the second logical value, such as the logical zero to provide an example, when the BL 454 is greater than the $\overline{BL}$ 456. In another exemplary embodiment, the comparator circuit 414 provides the second logical value, such as the logical zero to provide an example, when the BL 454 is greater than the $\overline{BL}$ 456 by, for example, at least the read margin value.

Second Exemplary Operation of the Exemplary Read-Only Memory (ROM) Device

FIG. 5, FIG. 6A, FIG. 6B, and FIG. 6C illustrate a second exemplary operation of the exemplary ROM device according to an exemplary embodiment of the present disclosure. In the exemplary embodiment illustrated in FIG. 5, a ROM device 500 represents non-programmable device whose memory cells are electrically designed, or "hard-wired," to be electrically coupled to their corresponding BLs from among the BLs 116.1 through 116.*m* or their corresponding $\overline{BLs}$ from among $\overline{BLs}$ 118.1 through 118.*m* as described above in FIG. 1. In the exemplary embodiments illustrated in FIG. 5, FIG. 6A, FIG. 6B, and FIG. 6C, the memory cells can be "hard-wired" to their corresponding BLs from among the BLs 116.1 through 116.*m* to store a first logical value, such as a logical one. Otherwise, the memory cells can be "hard-wired" to their corresponding $\overline{BLs}$ from among $\overline{BLs}$ 118.1 through 118.*m* to store a second logical value, such as a logical zero. The ROM device 500 includes the memory cells 110.1.1 through 110.*m.n* as described above in FIG. 1, the pre-charge circuitry 202, the differential sense amplifier 206, and the memory controller 212 as described above in FIG. 2, and switching circuitry 504.1 through 504.*m*. The ROM device 500 shares many substantially similar features as the ROM device 200 as described above in FIG. 2, FIG. 3A, and FIG. 3B; therefore, only differences between the ROM device 200 and the ROM device 500 are to be described in further detail.

Figure 5:
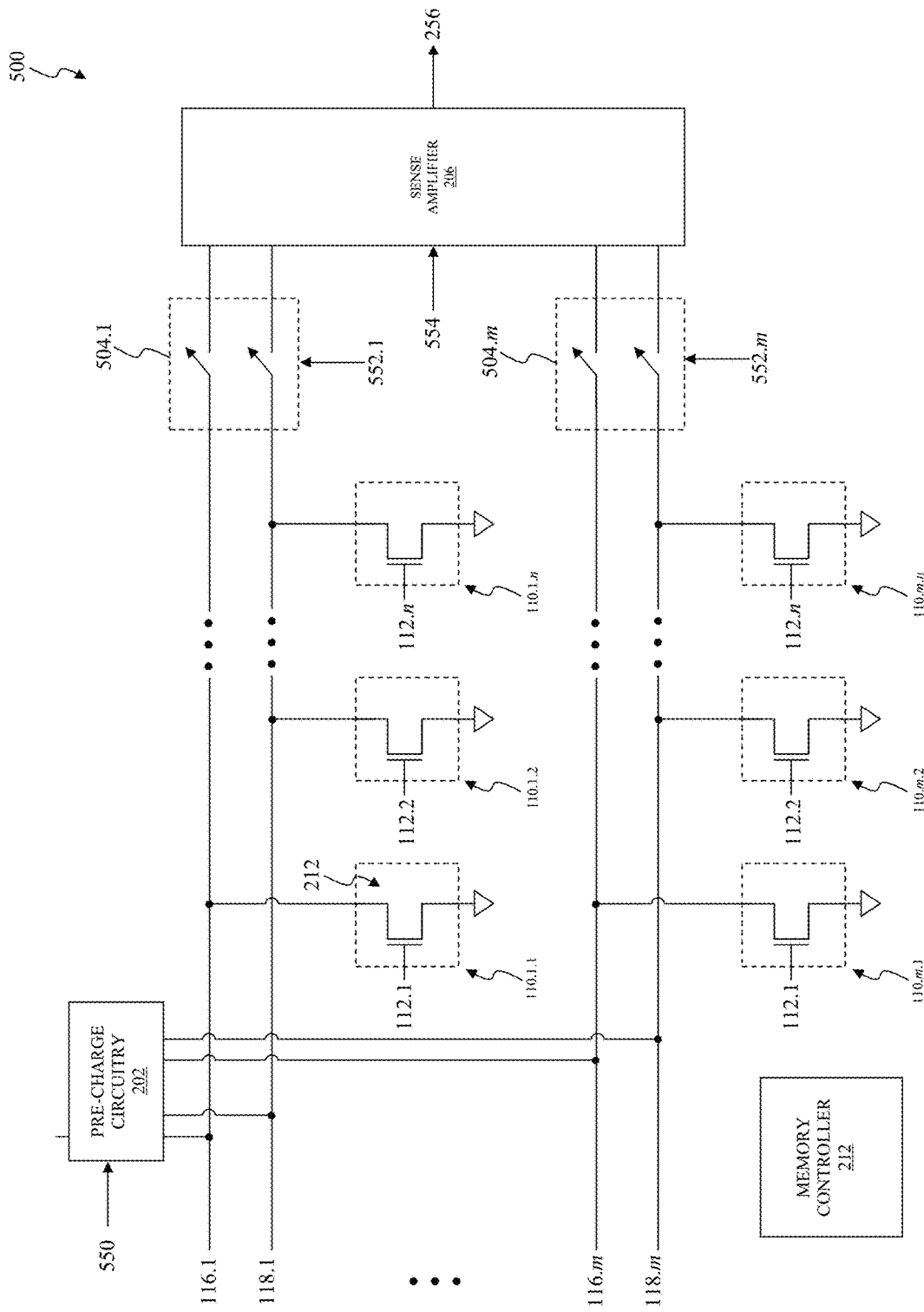
Figure 6A:
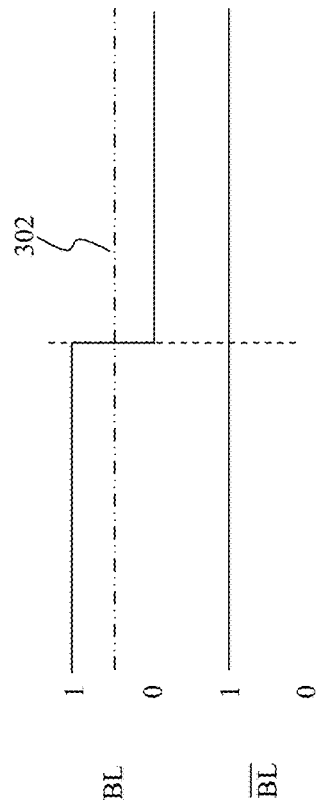

To read information stored in a memory cell 110.*x* from among the memory cells 110.1.1 through 110.*m.n*, the memory controller 212 sets a pre-charge enable control signal 550 to a first logical value, such as the logical one, as illustrated in FIG. 6A. In the exemplary embodiment illustrated in FIG. 5, the pre-charge circuitry 202 selectively charges one or more of the BLs 116.1 through 116.*m* and one or more of the corresponding $\overline{BLs}$ 118.1 through 118.*m* in a substantially similar manner as described above in FIG. 2, FIG. 3A, and FIG. 3B in response to the pre-charge enable control signal 550 being at the first logical value.

Moreover, the memory controller 212 sets switching control signals 552.1 through 552.*m* to the first logical value, such as the logical one, and a sense amplifier control signal 554 to a second logical value, such as a logical zero to provide an example, as illustrated in FIG. 6A. As illustrated in FIG. 5, the switching circuitry 504.1 through 504.*m* is coupled between the BLs 116.1 through 116.*m* and the $\overline{BLs}$ 118.1 through 118.*m* and the differential sense amplifier 206. The switching circuitry 504.1 through 504.*m* electrically couples and/or electrically decouples the BLs 116.1 through 116.*m* and the $\overline{BLs}$ 118.1 through 118.*m* to/from the differential sense amplifier 206 in response to the switching control signals 552.1 through 552.*m*.

In the exemplary embodiment illustrated in FIG. 5, the switching circuitry 504.1 through 504.*m* include first switches, such as p-type metal-oxide-semiconductor (PMOS) devices, to electrically couple and/or electrically decouple the BLs 116.1 through 116.*m* to/from the differential sense amplifier 206 and second switches, such as PMOS devices, to electrically couple and/or electrically decouple the $\overline{BLs}$ 118.1 through 118.*m* to/from the differential sense amplifier 206. In this exemplary embodiment, the first switches electrically couple the BLs 116.1 through 116.*m* to the differential sense amplifier 206 when their corresponding switching control signals 552.1 through 552.*m* are at the second logical value, such as the logical zero, and electrically decouple the BLs 116.1 through 116.*m* from the differential sense amplifier 206 when their corresponding switching control signals 552.1 through 552.*m* are at the first logical value, such as the logical one. Similarly, the second switches electrically couple the $\overline{BLs}$ 118.1 through 118.*m* to the differential sense amplifier 206 when their corresponding switching control signals 552.1 through 552.*m* are at the second logical value, such as the logical zero, and electrically decouple the $\overline{BLs}$ 118.1 through 118.*m* from the differential sense amplifier 206 when their corresponding switching control signals 552.1 through 552.*m* are at the first logical value, such as the logical one.

Figure 6B:
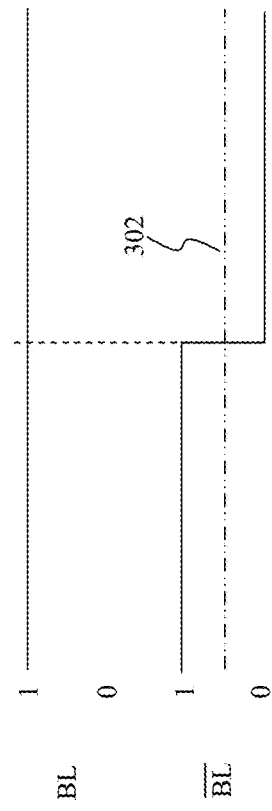
Figure 6C:
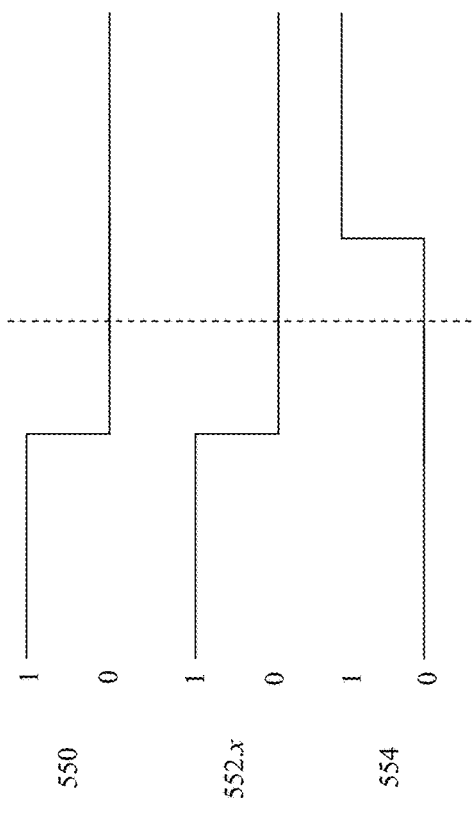

This configuration of the pre-charge enable control signal 550, the switching control signals 552.1 through 552.*m*, and the sense amplifier control signal 554 pre-charges one or more of the BLs 116.1 through 116.*m* and one or more of the $\overline{BLs}$ 118.1 through 118.*m* to the first logical value, such as the logical one, as illustrated in FIG. 6B and FIG. 6C in a substantially similar manner as described above in FIG. 2, FIG. 3A, and FIG. 3B. This configuration of the pre-charge enable control signal 550, the switching control signals 552.1 through 552.*m*, and the sense amplifier control signal 554 also disables the differential sense amplifier 206 and decouples the BLs 116.1 through 116.*m* and the $\overline{BLs}$ 118.1 through 118.*m* from the differential sense amplifier 206.

Next, the memory controller 212 sets the pre-charge enable control signal 550 and a switching control signal 552.*x* from among the switching control signals 552.1 through 552.*m* that corresponds to the memory cell 110.*x* to the second logical value, such as the logical zero, as shown in FIG. 6A. This configuration of the pre-charge enable control signal 550 and the switching control signal 552.*x* disables the pre-charge circuitry 202 leaving the BLs 116.1 through 116.*m* and the $\overline{BLs}$ 118.1 through 118.*m* at the first logical value, such as the logical one, and couples a BL from the BLs 116.1 through 116.*m* and a $\overline{BL}$ from among the $\overline{BLs}$ 118.1 through 118.*m* corresponding to the memory cell to the differential sense amplifier 206. Thereafter, the memory controller 212 asserts a WL from among WLs 112.1 through 112.*n* which corresponds to the memory cell 110.*x* to activate the memory cell 110.*x* as indicated by the dashed line in FIG. 6A, FIG. 6B, and FIG. 6C to discharge the BL and the $\overline{BL}$ in a substantially similar manner as described above in FIG. 2, FIG. 3A, and FIG. 3B.

Thereafter, the memory controller 212 sets the sense amplifier control signal 554 to the first logical value, such as the logical one to provide an example, after assertion of the WL as illustrated in FIG. 6A, to enable the differential sense amplifier 206 to read the information stored in the memory cell 110.x in a substantially similar manner as described above in FIG. 2, FIG. 3A, and FIG. 3B.

Exemplary Integrated Circuit Layout for an Exemplary Memory Cell within the Exemplary Read-Only Memory (ROM) Device FIGS. 7A and 7B illustrate integrated circuit layouts for an exemplary memory cell within the ROM device according to an exemplary embodiment of the present disclosure. An exemplary integrated circuit layout 700 as illustrated in FIG. 7A and FIG. 7B can be used to implement one or more of the memory cells 110.1.1 through 110.m.n as described above in FIG. 1. FIG. 7A represents a first integrated circuit layout having one or more semiconductor devices situated onto a diffusion layer and/or one or more polysilicon layers within a semiconductor substrate and FIG. 7B represents a second integrated circuit layout having one or more via structures for electrically connecting the one or more semiconductor devices. As illustrated in FIG. 7A, the exemplary integrated circuit layout 700 includes a semiconductor device 702 that is fabricated onto diffusion layers, polysilicon layers, and/or metal layers of a semiconductor substrate and include one or more interconnections between these layers. The one or more semiconductor devices are defined in terms of planar geometric shapes which correspond to an oxide diffusion (OD) region 712 within the diffusion layer for forming one or more actives regions of the one or more semiconductor devices, one or more polysilicon regions within the one or more polysilicon layers, one or more metal regions within the one or more metal layers, and the one or more interconnections.

As illustrated in FIG. 7A, the OD region 712, illustrated using hashing in FIG. 7A, represents an active diffusion region upon which active regions of the semiconductor device 702 can be formed. In an exemplary embodiment, the semiconductor device 702 represents a Fin Field Effect Transistor ("FinFET"). In this exemplary embodiment, the OD region 712 represents one or more fins of the FinFET. In the exemplary embodiment illustrated in FIG. 7A, the OD region is doped with impurity atoms of a donor type, such as phosphorus, arsenic, or antimony to provide some examples, that are capable of donating an electron to form active regions of n-type metal-oxide-semiconductor (NMOS) devices. A first polysilicon region 704, illustrated using dotted shading in FIG. 7A, overlaps the OD region 712 to form a gate (G) region of the semiconductor device 702. A second polysilicon region 706, also illustrated using dotted shading in FIG. 7A, similarly overlaps the OD region 712. In the exemplary embodiment illustrated in FIG. 7A, the second polysilicon region 706 represents a dummy polysilicon region to provide electrical isolation between the semiconductor device 702 and other semiconductor devices of other memory cells from among the memory cells 110.1.1 through 110.m.n. The first polysilicon region 704 and the second polysilicon region 706 can be doped with impurity atoms of the acceptor type.

A first metal region 708, illustrated using a horizontal shading in FIG. 7A, represents a metal layer used for routing a BL to a drain (D) region of the semiconductor device 702. The first metal region 708 is connected to the source (S) region of the semiconductor device 702 using a via structure, illustrated using a "squared-x" in FIG. 7A. In an exemplary embodiment, the various via structures, illustrated using the "squared-x's" in FIGS. 7A and 7B, described herein can represent through hole via structures, blind via structures, buried via structures, or any other suitable via structures that will be apparent to those skilled in the relevant art(s) without departing from the spirit and scope of the present disclosure.

A second metal region 710, also illustrated using the horizontal shading in FIG. 7A, represents a metal layer used for routing a ground connection to a source (S) region of the semiconductor device 702. The second metal region 710 is connected to the source (S) region of the semiconductor device 702 using an interconnection, illustrated using a "squared-x" in FIG. 7A. In an exemplary embodiment, the first metal region 708 and the second metal region 710 can be situated within a metal diffusion (MD) layer within the one or more metal layers of the semiconductor substrate. In this exemplary embodiment, the MD layer represents a metal layer which is diffused to the OD region 712.

As illustrated in FIG. 7B, a third metal region 714 and a fourth metal region 716, illustrated using vertical shading in FIG. 7B, route the WL to the gate (G) region of the semiconductor device 702. The third metal region 714 and the fourth metal region 716 are connected to the first polysilicon region 704 using an interconnection, illustrated using a "squared-x" in FIG. 7B. A fifth metal region 718 and a sixth metal region 720, illustrated using the vertical shading in FIG. 7B, route the BL and the $\overline{BL}$, respectively, to the source (S) region of the semiconductor device 702. The fifth metal region 718 is connected to the source (S) region of the semiconductor device 702 using an interconnection, illustrated using a "squared-x" in FIG. 7B when the semiconductor device 702 is to store a logical one. Otherwise, the sixth metal region 720 is to be connected to the source (S) region of the semiconductor device 702 using an interconnection, illustrated using a "squared-x" in FIG. 7B when the semiconductor device 702 is to store a logical zero. A seventh metal region 722, illustrated using the vertical shading in FIG. 7B, represents a metal layer used for routing the ground connection to the drain (D) region of the semiconductor device 702. The seventh metal region 722 is connected to the second metal region 710 using an interconnection, illustrated using a "squared-x" in FIG. 7B. In an exemplary embodiment, the third metal region 714, the fourth metal region 716, the fifth metal region 718, the sixth metal region 720, and the seventh metal region 722 can be situated within a first metal layer, often referred to as M0, within the one or more metal layers of the semiconductor substrate.

Exemplary Operational Control Flow for the Exemplary Read-Only Memory (ROM) Device FIG. 8 illustrates a flowchart of exemplary operations for the ROM device according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes multiple phases of an exemplary operational control flow 800 of a ROM device, such as the ROM device 100, the ROM device 200, and/or the ROM device 500 to provide some examples.

At operation 802, the operational control flow 800 enters into a first phase of operation to pre-charge the one or more of BLs 116.1 through 116.m and one or more of the $\overline{BLs}$ 118.1 through 118.m. The operational control flow 800 can pre-charge one or more of the BLs 116.1 through 116.m and one or more of the $\overline{BLs}$ 118.1 through 118.m to a first logical value, such as the logical one to provide an example.

At operation 804, the operational control flow 800 enters into a second phase of operation to disable the pre-charging of the BLs 116.1 through 116.m and the $\overline{BLs}$ 118.1 through 118.*m*. The BLs 116.1 through 116.*m* and the $\overline{BL}$s 118.1 through 118.*m* remain at the first logical value, such as the logical one to provide an example, in response to disabling of the pre-charging.

At operation 806, the operational control flow 800 enters into a third phase of operation to assert a WL from among the WLs 112.1 through 112.*n* corresponding to a memory cell of the ROM device to activate the memory cell. In this third phase of operation, the assertion of the corresponding WLs causes the corresponding BL of the memory cell to be a second logical value, such as a logical zero, when the memory cell is electrically coupled to its corresponding BL or causes the corresponding $\overline{BL}$ of the memory cell to be a second logical value, such as a logical zero, when the memory cell is electrically coupled to its corresponding $\overline{BL}$.

At operation 808, the operational control flow 800 enters into a fourth phase of operation to enable reading of the corresponding BL of the memory cell and the corresponding $\overline{BL}$ of the memory cell. In this fourth phase of operation, the operational control flow 800 reads the first logical value, such as the logical one, as being stored within the memory cell when the corresponding BL of the memory cell is less than the corresponding $\overline{BL}$ of the memory cell by at least a read margin value. Otherwise, the operational control flow 800 reads a second logical value, such as the logical zero, as being stored within the memory cell when the corresponding BL of the memory cell is greater than the corresponding $\overline{BL}$ of the memory cell by at least the read margin value.

CONCLUSION

The foregoing Detailed Description discloses a read-only memory (ROM) device. The ROM device includes a memory cell and a sense amplifier. The memory cell is coupled to a bitline (BL) or to a $\overline{BL}$. The sense amplifier reads a first logical value as being stored within the memory cell in response to the BL being less than the $\overline{BL}$ and reads a second logical value different from the first logical value as being stored within the memory cell in response to the BL being greater than the $\overline{BL}$.

The foregoing Detailed Description additionally discloses a memory device. The memory device includes memory cells, pre-charge circuitry, a memory controller, and sense amplifier. The memory cells are configured to be in rows and columns, each column from among the plurality of columns being coupled to a corresponding differential bitline (BL) from among multiple differential BLs. The pre-charge circuitry pre-charges at least a differential bitline from among the plurality of differential BLs that corresponds to a memory cell from among the plurality of memory cells to a first logical value. The memory controller activates the memory cell. The memory cell, when activated, discharges a BL from among the differential bitline to at least a read margin value less than the first logical value when the memory cell is coupled to the BL or discharges a $\overline{BL}$ from among the differential bitline to at least the read margin value when the memory cell is coupled to the $\overline{BL}$. The sense amplifier reads a first logical value as being stored within the memory cell in response to the BL being less than the $\overline{BL}$ by at least the read margin value and reads the second logical value as being stored within the memory cell in response to the BL being greater than the $\overline{BL}$ by at least the read margin value.

The foregoing Detailed Description discloses a method for operating a read-only memory (ROM) device having memory cells. The method includes: pre-charging a bitline (BL) of the ROM device and a $\overline{BL}$ of the ROM device to a first logical value, activating a memory cell from among the memory cells; and reading, by the ROM device, a first logical value as being stored within the memory cell in response to the BL being less than the $\overline{BL}$ or the second logical value as being stored within the memory cell in response to the BL being greater than the $\overline{BL}$.

The Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The Detailed Description is not meant to limiting. Rather, the scope of the disclosure is defined only in accordance with the following claims and their equivalents. It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the following claims and their equivalents in any way.

The exemplary embodiments described within the disclosure have been provided for illustrative purposes, and are not intended to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A read-only memory (ROM) device, comprising:
pre-charge circuitry configured to charge a bitline (BL) and a $\overline{BL}$ to a first logical value;
a memory cell having a switching device coupled to a control line, the switching device being coupled to the BL to store the first logical value within the memory cell or to the $\overline{BL}$ to store a second logical value within the memory cell,
wherein assertion of the control line configures the switching device to discharge the BL to be less than the first logical value when the switching device is coupled to the BL or to discharge the $\overline{BL}$ to be less than the first logical value when the switching device is coupled to the $\overline{BL}$; and
a sense amplifier configured to:
read the first logical value as being stored within the memory cell in response to the BL being less than the $\overline{BL}$, and
read the second logical value different from the first logical value as being stored within the memory cell in response to the BL being greater than the $\overline{BL}$.

2. The ROM device of claim 1, wherein assertion of the control line configures the switching device to discharge the BL from the first logical value to at least a read margin value less than the first logical value when coupled to the BL or to discharge the $\overline{BL}$ from the first logical value to at least the read margin value when coupled to the $\overline{BL}$.

3. The ROM device of claim 1, wherein the switching device comprises:
a plurality of connections,
wherein a first connection from among the plurality of connections is coupled to a ground connection, and
wherein a second connection from among the plurality of connections is coupled to the BL or to the $\overline{BL}$.

4. The ROM device of claim 1, wherein the control line comprises a wordline (WL), and
further comprising:
a memory controller configured to assert the WL that corresponds to the memory cell.

5. The ROM device of claim 1, further comprising:
switching circuitry configured to decouple the BL and the $\overline{BL}$ from the sense amplifier while the pre-charge circuitry is configured to charge the BL and the $\overline{BL}$.

6. A memory device, comprising:
a plurality of memory cells being configured to be in a plurality of rows and a plurality of columns, each column from among the plurality of columns being coupled to a corresponding differential bitline (BL) from among a plurality of differential BLs, a first group of memory cells from among the plurality of memory cells being coupled to BLs from among the plurality of differential BLs and a second group of memory cells from among the plurality of memory cells being coupled to $\overline{BLs}$ from among the plurality of differential BLs;
pre-charge circuitry configured to pre-charge at least a differential BL from among the plurality of differential BLs that corresponds to a memory cell from among the plurality of memory cells to a first logical value;
a memory controller configured to activate the memory cell, the memory cell, when activated, being configured to discharge a BL from among the plurality of differential BLs to at least a read margin value less than the first logical value when the memory cell is coupled to the BL or to discharge a $\overline{BL}$ from among the plurality of differential BLs to at least the read margin value when the memory cell is coupled to the $\overline{BL}$; and
a sense amplifier configured to:
read the first logical value as being stored within the memory cell in response to the BL being less than the $\overline{BL}$ by at least the read margin value, and
read the second logical value as being stored within the memory cell in response to the BL being greater than the $\overline{BL}$ by at least the read margin value.

7. The memory device of claim 6, wherein the memory device comprises:
a read-only memory (ROM) device.

8. The memory device of claim 7, wherein the first group of memory cells is coupled to the BLs and the second group of memory cells is coupled to the $\overline{BLs}$ during fabrication of the memory device.

9. The memory device of claim 6, wherein the memory cell comprises:
a switching device having a plurality of connections,
wherein a first connection from among the plurality of connections is coupled to a ground connection, and
wherein a second connection from among the plurality of connections is coupled to the BL or to the $\overline{BL}$.

10. The memory device of claim 9, wherein the switching device comprises:
an n-type metal-oxide-semiconductor field-effect (NMOS) transistor.

11. The memory device of claim 9, wherein the switching device comprises:
a dummy polysilicon region arranged to provide electrical isolation between the switching device and other switching devices of other memory cells from among the plurality of memory cells.

12. The memory device of claim 6, wherein the sense amplifier comprises:
a comparator configured to compare the BL and the $\overline{BL}$.

13. The memory device of claim 6, wherein the memory controller is configured to assert a wordline (WL) to activate the memory cell.

14. A method for operating a read-only memory (ROM) device having a plurality of memory cells, the method comprising:
pre-charging, by the ROM device, a bitline (BL) of the ROM device and a $\overline{BL}$ of the ROM device to a first logical value;
activating, by the ROM device, a memory cell from among the plurality of memory cells to discharge the BL to be less than the first logical value when the memory cell is coupled to the BL or to discharge the $\overline{BL}$ to be less than the first logical value when the memory cell is coupled to the $\overline{BL}$; and
reading, by the ROM device, the first logical value as being stored within the memory cell in response to the BL being less than the $\overline{BL}$ or the second logical value as being stored within the memory cell in response to the BL being greater than the $\overline{BL}$.

15. The method of claim 14, further comprising:
hard-wiring the memory cell to the BL or to the $\overline{BL}$.

16. The method of claim 14, wherein the activating comprises:
asserting a wordline (WL) after the pre-charging of the BL and the $\overline{BL}$ to activate the memory cell.

17. The method of claim 14, further comprising:
decoupling, by the ROM device, the BL and the $\overline{BL}$ from a sense amplifier of the ROM device prior to the pre-charging.

18. The method of claim 17, further comprising:
coupling, by the ROM device, the BL and the $\overline{BL}$ to the sense amplifier of the ROM device prior to the reading.

19. The method of claim 14, wherein the activating comprises:
activating the memory cell to discharge the BL from the first logical value to at least a read margin value less than the first logical value when the memory cell is coupled to the BL or to discharge the $\overline{BL}$ from the first logical value to at least the read margin when the memory cell is coupled to the $\overline{BL}$.

* * * * *